United States Patent
Park et al.

(10) Patent No.: US 8,132,953 B2
(45) Date of Patent: Mar. 13, 2012

(54) LIGHT EMITTING DIODE SUBSTRATE MODULE AND METHOD OF MANUFACTURING THE SAME, AND BACKLIGHT UNIT AND METHOD OF MANUFACTURING THE SAME

(75) Inventors: Jung Kyu Park, Seoul (KR); Seong Ah Joo, Gyunggi-do (KR); Seung Hwan Choi, Gyunggi-do (KR)

(73) Assignee: Samsung LED Co., Ltd., Gyunggi-Do (KR)

(*) Notice: Subject to any disclaimer, the term of this patent is extended or adjusted under 35 U.S.C. 154(b) by 716 days.

(21) Appl. No.: 12/244,393

(22) Filed: Oct. 2, 2008

(65) Prior Publication Data

US 2009/0161343 A1 Jun. 25, 2009

(30) Foreign Application Priority Data

Dec. 24, 2007 (KR) .................. 10-2007-0136264

(51) Int. Cl.
*F21V 7/04* (2006.01)
(52) U.S. Cl. ......... 362/612; 362/341; 362/344; 362/800
(58) Field of Classification Search .................. 362/612, 362/341, 344, 800
See application file for complete search history.

(56) References Cited

U.S. PATENT DOCUMENTS

| 2,820,228 A | * | 1/1958 | Rodman | 228/185 |
| 5,857,767 A | | 1/1999 | Hochstein | |
| 2007/0102710 A1 | * | 5/2007 | Martter et al. | 257/79 |
| 2007/0229995 A1 | * | 10/2007 | Kawato et al. | 359/883 |

FOREIGN PATENT DOCUMENTS

JP 2007-27695 2/2007

* cited by examiner

*Primary Examiner* — William Carter
(74) *Attorney, Agent, or Firm* — McDermott Will & Emery LLP

(57) ABSTRACT

There are provided a light emitting diode substrate module and a method of manufacturing the same, and a backlight unit and a method of manufacturing the same. A light emitting diode substrate module according to an aspect of the invention includes: a metal plate; an insulating film having a predetermined thickness and provided on an entire outer surface of the metal plate; a reflective film having a predetermined thickness and provided on an entire outer surface of the insulating film; and at least one light emitting diode package electrically connected to a driving circuit provided on the reflective film by pattern printing.

Unnecessary material costs can be avoided by forming a predetermined driving circuit by pattern printing, and optical characteristics can be improved by stably maintaining reflection characteristics.

16 Claims, 7 Drawing Sheets

LIGHT EMITTING DIODE SUBSTRATE MODULE AND METHOD OF MANUFACTURING THE SAME, AND BACKLIGHT UNIT AND METHOD OF MANUFACTURING THE SAME

CROSS-REFERENCE TO RELATED APPLICATIONS

This application claims the priority of Korean Patent Application No. 2007-0136264 filed on Dec. 24, 2007, in the Korean Intellectual Property Office, the disclosure of which is incorporated herein by reference.

BACKGROUND OF THE INVENTION

1. Field of the Invention

The present invention relates to light emitting diode substrate modules and a method of manufacturing the same, and backlight units and a method of manufacturing the same.

2. Description of the Related Art

In general, image display devices for displaying images are included in various kinds of electronic apparatuses, such as mobile communication terminals, digital cameras, laptop computers, monitors, and TVs. Various kinds of image display devices can be used. However, flat panel displays having a flat-panel shape are generally used in terms of characteristics of the electronic devices. Among the flat panel displays, liquid crystal displays (LCDs) are widely used.

The liquid crystal display is one of the flat panel displays, and displays an image by using liquid crystal. As compared to other flat panel displays, the liquid crystal display is thin and lightweight, and has a low driving voltage and less power consumption. For these reasons, the liquid crystal display is used widely across all industries.

The liquid crystal display includes a liquid crystal display panel displaying an image by using light and a backlight unit providing light to the liquid crystal display panel.

The backlight unit includes a light emitting diode substrate module that uses small light emitting diodes as light sources in consideration of product characteristics. The light emitting diodes constitute point light sources that have a small emitting area.

The light emitting diode substrate module is divided into a direct type and an edge type according to the arrangement of the light emitting diodes that form point light sources. The direct type light emitting diode substrate module includes a plurality of light emitting diodes that are arranged below a liquid display panel. The edge type light emitting diode substrate module includes a plurality of light emitting diodes that are arranged at the edge of one side of a light guide plate. The direct type light emitting substrate module is generally used for a backlight unit of a large TV. The edge type light emitting substrate module is generally used for a backlight unit of a mobile display or a computer monitor.

FIG. 1 is a configuration view illustrating a light emitting diode substrate module according to the related art. FIG. 2A is a cross-sectional view illustrating a backlight unit according to the related art. FIG. 2B is a plan view illustrating the backlight unit according to the related art.

As shown in FIG. 1, a direct type light emitting diode substrate module 1 includes a substrate 2, and a plurality of light emitting diode packages 5. The substrate 2 has excellent heat conductivity and a driving circuit formed on an upper surface thereof by patterning. Each of the plurality of light emitting diode packages 5 includes a package body 4 mounted with a light emitting chip 3, and is mounted onto the upper surface of the substrate 2 to receive an electric driving signal.

The backlight unit 10 includes a plurality of metal chassis 11 that are secured by a plurality of fastening members and are mechanically fixed to the bottom.

A gap pad 12 may be additionally embedded and disposed between a lower surface of the substrate module 1 and the bottom of the metal chassis 11 so as to improve heat radiation characteristics.

However, when the light emitting diode substrate module 1 is manufactured, in order to form the mechanical driving circuit by patterning, a copper film is applied over the entire surface of the substrate 2 without considering an area of the copper film that is actually required, which causes a waste of the copper film.

Further, a white or whitish protection mask in which $TiO_2$ is contained in a polymer in order to prevent an area of the driving circuit formed on the surface of the substrate 2 by patterning. The protection mask is discolored due to deterioration of the polymer during a mounting process to reduce reflection characteristics. For this reason, an additional reflective plate needs to be provided at a front surface of the substrate.

When the backlight unit 10 is manufactured, the substrate module 1 may be mounted to the metal chassis 11 by using various kinds of assembling methods, each of which includes an assembling process of securing the substrate module 1 to the metal chassis 11. Therefore, it takes a time to perform the assembling process, and at the same time, an additional structure, such as the gap pad 12, is required.

Further, fastening holes 13 and 14 need to be provided in the substrate 2 and the metal chassis 11. The assembling process is complicated due to the additional process of forming the holes.

Furthermore, the plurality of substrate modules 1 mounted to one metal chassis 11 need connectors 15 to electrically connect one substrate to another substrate adjacent to the substrate, which increases the number of components and time to perform the assembling process.

SUMMARY OF THE INVENTION

An aspect of the present invention provides a light emitting diode substrate module and a method of manufacturing the same that can avoid unnecessary material costs by forming a predetermined driving circuit by pattern printing, and improve optical characteristics by stably maintaining reflection characteristics.

Another aspect of the present invention provides a backlight unit and a method of manufacturing the same that can reduce the number of components to reduce manufacturing costs, simplify a manufacturing process, and increase design flexibility, and can stably maintain optical characteristics even in a high-temperature environment.

According to an aspect of the present invention, there is provided a light emitting diode substrate module including: a metal plate; an insulating film having a predetermined thickness and provided on an entire outer surface of the metal plate; a reflective film having a predetermined thickness and provided on an entire outer surface of the insulating film; and at least one light emitting diode package electrically connected to a driving circuit provided on the reflective film by pattern printing.

The metal plate may be formed of decarburized metal or stainless metal.

The insulating film may be formed of porcelain enamel.

The reflective film may be formed of porcelain enamel containing $TiO_2$.

The reflective film may further include a circuit protection film applied to the driving circuit to expose an external electrode electrically connected to the light emitting diode package to the outside.

According to another aspect of the present invention, there is provided a backlight unit having a metal chassis including a mounting part recessed to a predetermined depth in which the light emitting diode substrate module is mounted.

According to still another aspect of the present invention, there is provided a method of manufacturing a light emitting diode substrate module, the method including: forming an insulating film having a predetermined thickness on an entire surface of a metal plate; forming a reflective film having a predetermined thickness on an entire surface of the insulating film; and forming a driving circuit on an outer surface of the reflective film by pattern printing and electrically connecting the driving circuit to at least one light emitting diode package.

The forming an insulating film may include applying porcelain enamel to the outer surface of the metal plate formed of decarburized metal or stainless metal by using any one of a dry or wet spray method, or a dipping method, and firing and fusing the applied porcelain enamel at high temperature.

The forming a reflective film may include applying porcelain enamel containing $TiO_2$ on the entire outer surface of the insulating film by using any one of a dry or wet spray method, and a dipping method.

The forming a driving circuit on an outer surface of the reflective film by pattern printing may include forming a circuit protection film on the driving circuit to expose an external electrode electrically connected to the light emitting diode package to the outside.

According to yet another aspect of the present invention, there is provided a method of manufacturing a backlight unit, the method including mounting and fixing the light emitting diode substrate module manufactured by the method in a mounting part recessed to a predetermined depth in a metal chassis.

According to an aspect of the present invention, there is provided a backlight unit including: a metal chassis having a mounting part recessed to a predetermined depth; an insulating film having a predetermined thickness and provided on an entire outer surface of the metal chassis; a reflective film having a predetermined thickness and provided on the insulating film corresponding to the recess; and at least one light emitting diode package electrically connected to a driving circuit formed on the reflective film or the insulating film by pattern printing.

The metal chassis may be formed of decarburized metal or stainless metal.

The insulating film may be formed of porcelain enamel.

The reflective film may be formed of porcelain enamel containing $TiO_2$.

The driving circuit formed on the insulating film by pattern printing may expose to the outside, an external electrode electrically connected to the light emitting diode package by the reflective film applied to the insulating film.

The driving circuit formed on the reflective film by pattern printing may expose to the outside, an external electrode electrically connected to the light emitting diode package by a circuit protection film applied to reflective film.

According to another aspect of the present invention, there is provided a method of manufacturing a backlight unit, the method including: providing a metal chassis having a mounting part recessed to a predetermined depth; forming an insulating film having a predetermined thickness on an entire outer surface of the metal chassis; forming a driving circuit on the insulating film corresponding to the recess; and electrically connecting at least one light emitting diode package to the driving circuit partially exposed through a reflective film applied to the insulating film covering the driving circuit.

According to still another aspect of the present invention, there is provided a method of manufacturing a backlight unit, the method including: providing a metal chassis having a mounting part recessed to a predetermined depth; forming an insulating film having a predetermined thickness on an entire outer surface of the metal chassis; forming a reflective film having a predetermined thickness on the insulating film corresponding to the recess; and forming a driving circuit on the reflective film by pattern printing and electrically connecting at least one light emitting diode package to the driving circuit.

The forming an insulating film may include applying porcelain enamel to an outer surface of the metal chassis formed of decarburized metal or stainless metal by using any one of a dry or wet spray method, or a dipping method, and firing and fusing the applied porcelain enamel at high temperature.

The forming a reflective film may include applying porcelain enamel containing $TiO_2$ by using any one of a dry or wet spray method, and a dipping method.

The forming a driving circuit on the insulating film by pattern printing may include firing the driving circuit formed on the insulating film by pattern printing, and then exposing an external electrode electrically connected to the light emitting diode package to the outside by the reflective film applied to the insulating film.

The forming a driving circuit on the reflective film by pattern printing may include exposing an external electrode electrically connected to the light emitting diode package to the outside by the circuit protection film applied to the reflective film, and then firing the circuit protection film and the driving circuit.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
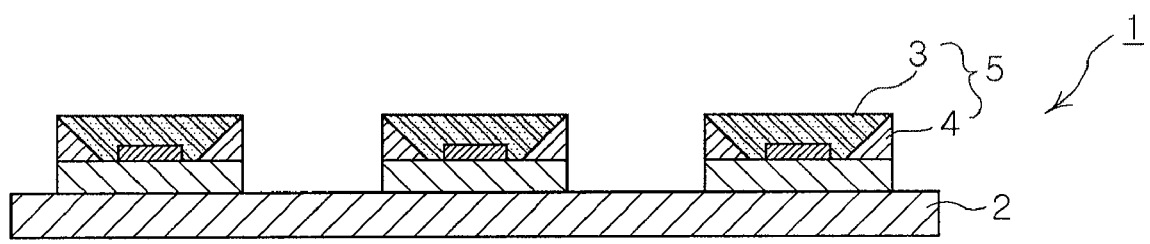
FIG. 1 is a configuration view illustrating a light emitting diode substrate module according to the related art.
Figure 2A:
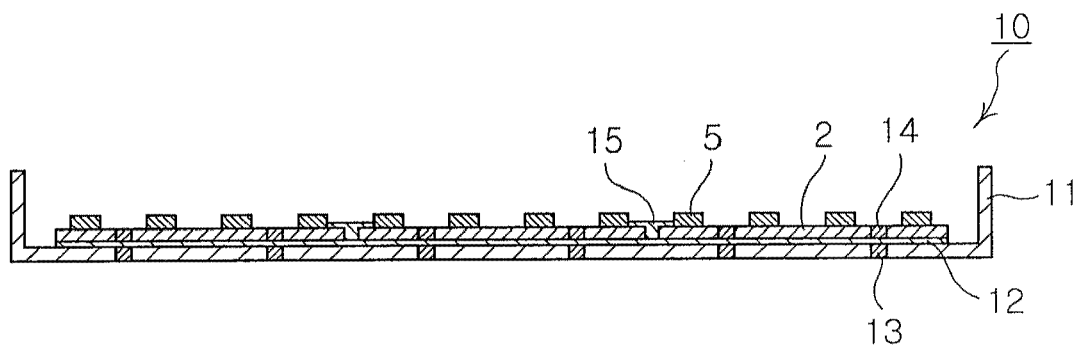
FIG. 2A is a cross-sectional view illustrating a backlight unit according to the related art.
Figure 2B:
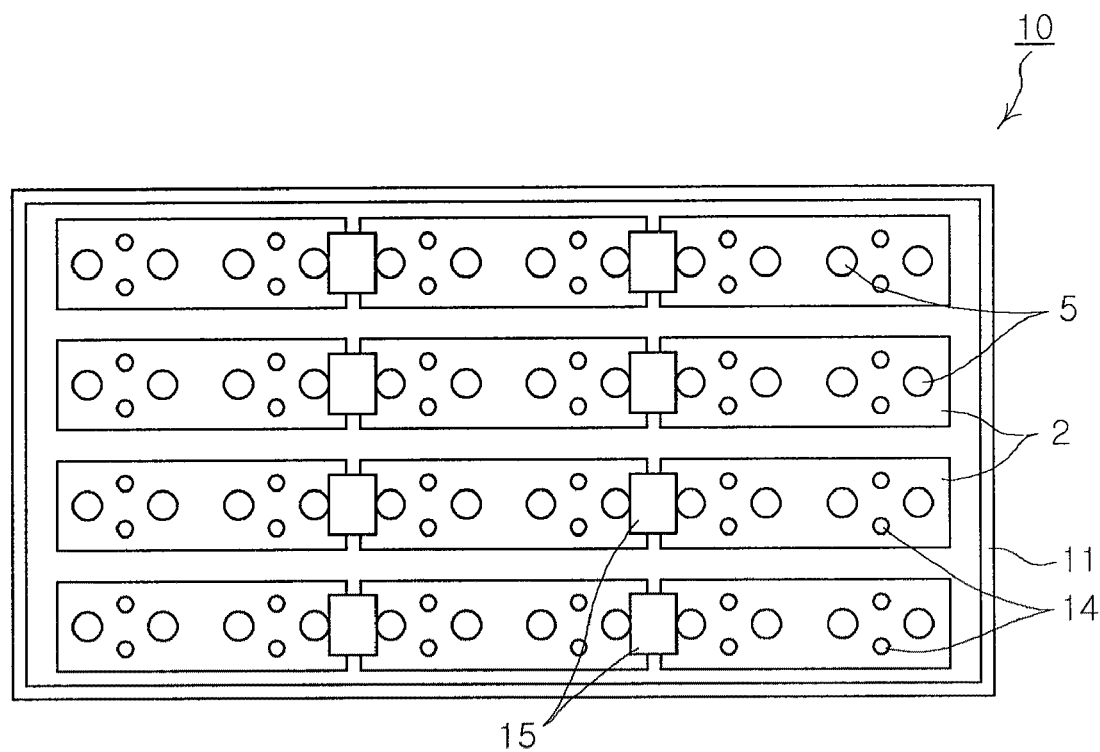
FIG. 2B is a plan view illustrating the backlight unit according to the related art.

Exemplary embodiments of the present invention will now be described in detail with reference to the accompanying drawings.

FIGS. 3A, 3B, 3C, and 3D are cross-sectional views of the process flow illustrating a method of manufacturing a light emitting diode substrate module according to an exemplary embodiment of the present invention. FIG. 4 is a plan view illustrating the light emitting diode substrate module according to the exemplary embodiment of the present invention.

As shown in FIGS. 3 and 4, a light emitting diode substrate module 100 according to the exemplary embodiment of the invention includes a metal plate 110, an insulating film 120, a reflective film 130, a circuit protection film 140, and a light emitting diode package 150.

Figure 3A:
FIGS. 3A to 3D are cross-sectional views illustrating the process flow for manufacturing a light emitting diode substrate module according to an exemplary embodiment of the present invention.
Figure 4:
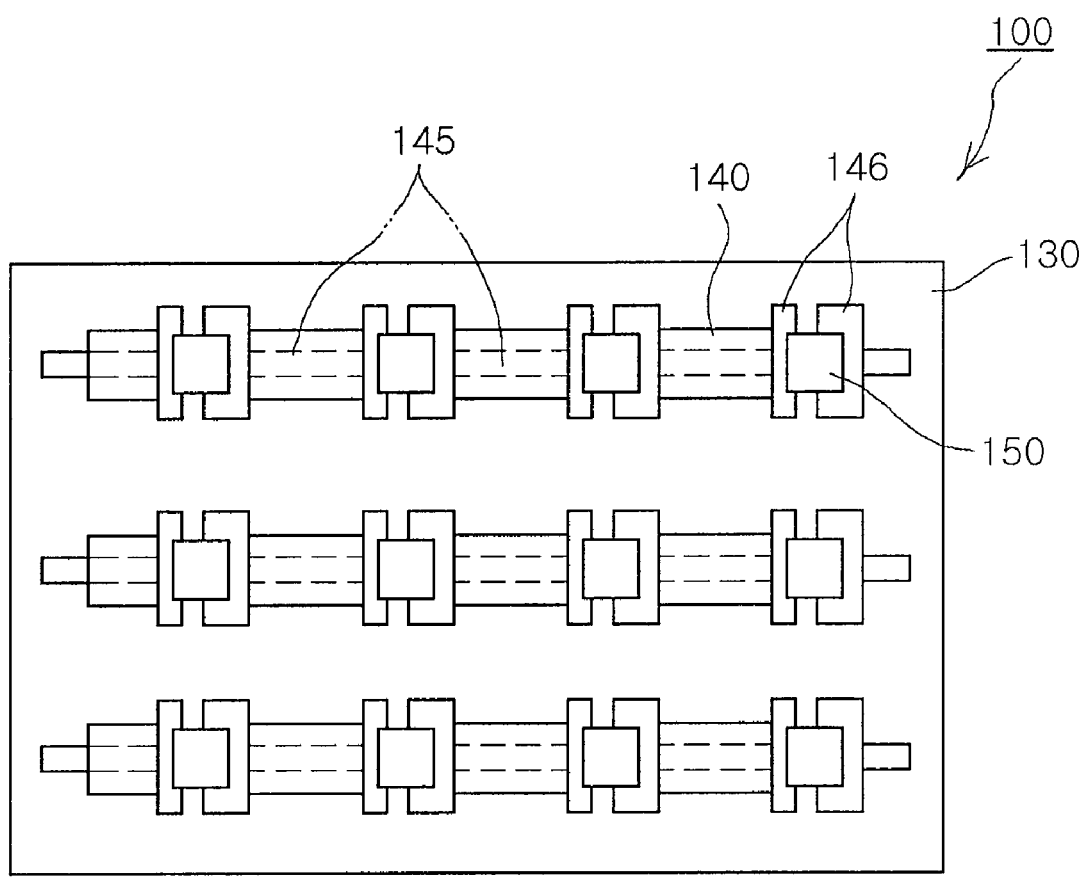
FIG. 4 is a plan view illustrating a light emitting diode substrate module according to an exemplary embodiment of the present invention.

As shown in FIGS. 3A and 4, the metal plate 110 is formed of a metallic material having excellent heat conductivity and a square-shape in order to radiate heat, generated when the light emitting diode package 150 emits light, to the outside.

Here, the metal plate 110 is formed of any one of decarburized metal or stainless metal.

Figure 3B:
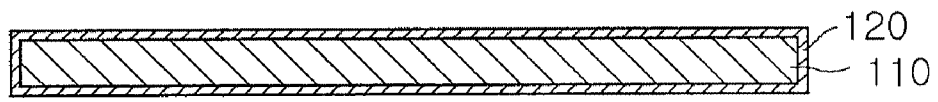

As shown in FIGS. 3B and 4, the insulating film 120 having a predetermined thickness is formed over the entire outer surface of the metal plate 110 to break electrical connection between the metal plate 110 and a driving circuit 145 to which the light emitting diode package 150 is connected.

Porcelain enamel is applied to the entire outer surface of the metal plate 110 formed of decarburized metal or stainless metal by using a dry or wet spray method, or a dipping method. Then, the applied porcelain enamel is fired and fused at a high temperature within a range of 800° to 900°. In this way, the insulating film 120 is formed.

Figure 3C:
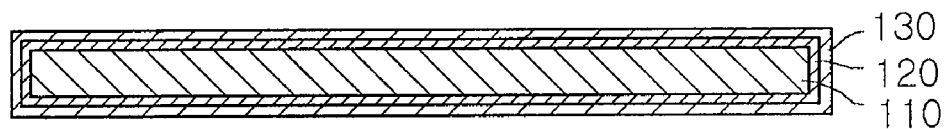
Figure 3D:
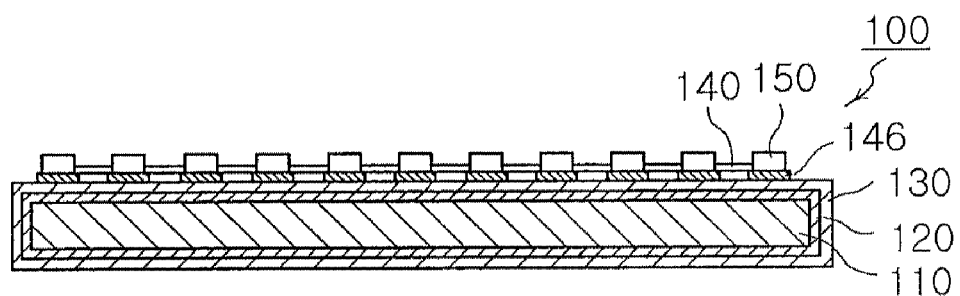

As shown in FIGS. 3C and 4, the reflective film 130 has a predetermined thickness and is evenly applied over the entire outer surface of the insulating film 120 to reflect light generated when the light emitting diode package 150 emits light.

Preferably, the reflective film 130 may be formed by applying porcelain enamel containing a predetermined amount of $TiO_2$ to the entire outer surface of the insulating film 120 by using a dry or wet spray method, or a dipping method.

The circuit protection film 140 is a protection member that is formed of white porcelain enamel. The circuit protection film 140 is placed over the driving circuit 145 except for external electrodes 146 in order to protect the driving circuit 145 formed by printing a pattern using a conductive material, such as Ag paste, on the outer surface of the reflective film 130 that corresponds to an upper surface of the metal plate 110 from outside environment.

The circuit protection film 140 is fired together with the driving circuit 145 formed by printing a pattern using the conductive material, such as Ag paste, on the outer surface of the reflective film 130, such that the circuit protection film 140 is adhered integrally to the reflective film 130.

The light emitting diode package 150 is a light emitting device that is electrically mounted onto at least one of the external electrodes 146 of the driving circuit 145 that are not covered by the circuit protection film 140 but exposed to the outside. The light emitting diode package 150 generates light when power is applied.

Figure 5:
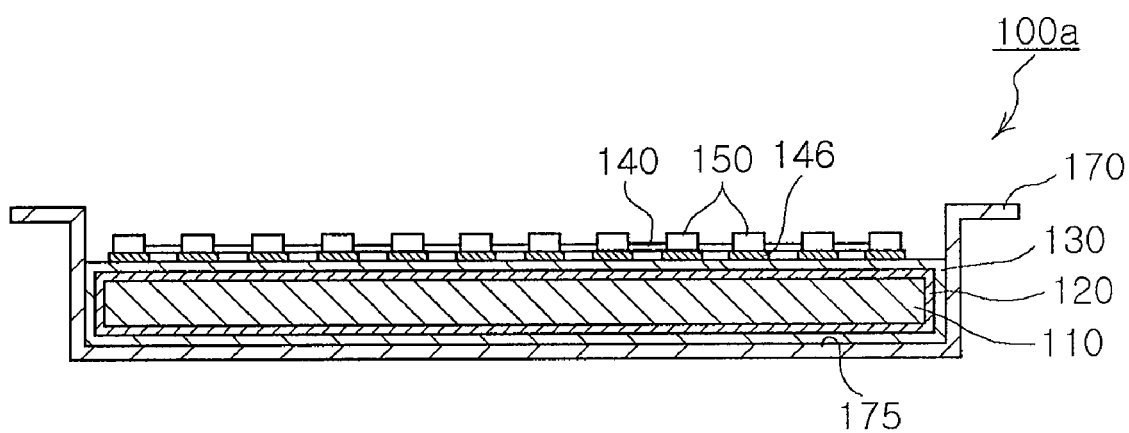
FIG. 5 is a cross-sectional view illustrating a backlight unit using the light emitting diode substrate module, shown in FIGS. 3A to 3D, and FIG. 4, according to an exemplary embodiment of the present invention.

FIG. 5 is a cross-sectional view illustrating a backlight unit 100a using the light emitting diode substrate module 100, shown in FIGS. 3A to 3D, and FIG. 4, according to an exemplary embodiment of the invention.

As shown in FIG. 5, the backlight unit 100a according to the embodiment of the invention includes a metal chassis 170 that has a mounting part 175 recessed to a predetermined depth. The substrate module 100 that includes the metal plate 110, the insulating film 120, the reflective film 130, the circuit protection film 140, and the light emitting diode packages 150 is mounted within the mounting part 175.

Preferably, the metal chassis 170 may be formed of metal that facilitates heat radiation to the outside when the light emitting diode package 150 emits light, and is subject to press-working to easily form the mounting part 175 having the predetermined depth.

The light emitting diode substrate module 100 mounted within the mounting part 175 of the metal chassis 170 is secured in position to the bottom surface of the mounting part 175 by using an adhesive or a fastening member to prevent separation.

The driving circuit 145 of the light emitting diode substrate module 100 mounted in the metal chassis 170 is electrically connected to a cable for supplying a driving signal.

Then, light control members, such as a diffusion plate, a prism sheet, and a protective film, and a liquid crystal panel are provided at an upper side of the metal chassis 170, such that the manufacture of the liquid crystal display is completed.

FIGS. 6A, 6B, 6C, 6D, 6E, and 6F are cross-sectional views illustrating the process flow for manufacturing a backlight unit according to another exemplary embodiment of the invention. FIGS. 7A, 7B, 7C, 7D, 7E, and 7F are cross-sectional views illustrating the process flow for manufacturing a backlight unit according to still another exemplary embodiment of the invention.

Figure 6A:
FIGS. 6A to 6F are cross-sectional views illustrating the flow process for manufacturing a backlight unit according to another exemplary embodiment of the present invention.
Figure 6B:
Figure 6C:
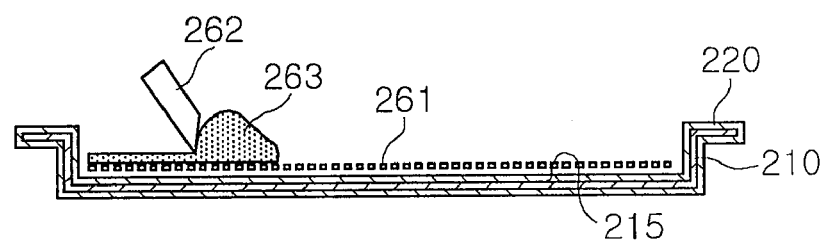
Figure 6D:
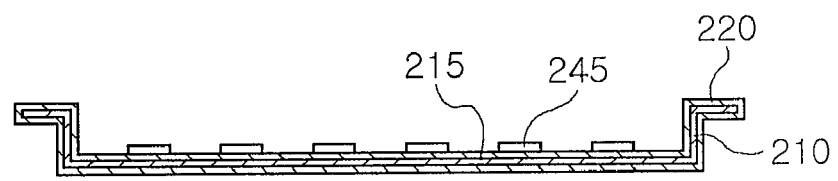
Figure 6E:
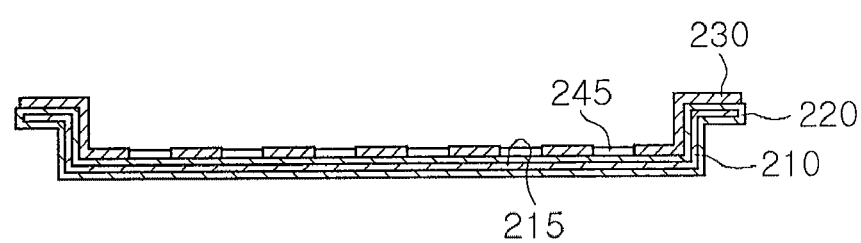
Figure 6F:
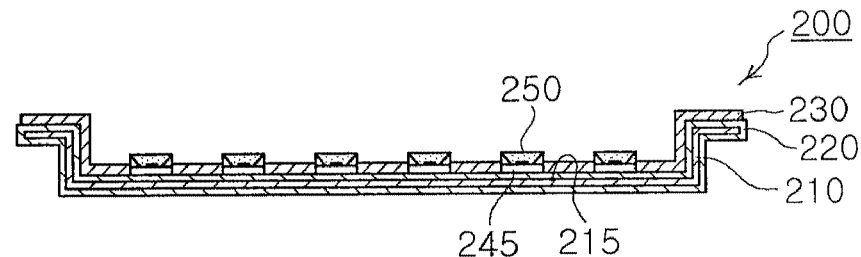
Figure 7A:
FIGS. 7A to 7F are cross-sectional views illustrating the flow process for manufacturing a backlight unit according to still another exemplary embodiment of the present invention.

As shown in FIGS. 6F and 7A, a backlight unit 200 according to the embodiment of the invention includes a metal chassis 210, an insulating film 220, a reflective film 230, and a light emitting diode package 250.

As shown in FIGS. 6A and 7A, the metal chassis 210 is a box-shaped metal structure that has excellent heat conductivity to radiate heat, generated when the light emitting diode package 250 emits light, to the outside, and includes a mounting part 215 that is recessed to a predetermined depth and has a closed bottom surface and an opened top.

Preferably, the metal chassis 210 may be formed of decarburized metal or stainless metal.

Figure 7B:

As shown in FIGS. 6B and 7B, the insulating film 220 has a predetermined thickness and is evenly applied the entire outer surface of the metal chassis 210 to break electrical connection between the metal chassis 210 and a driving circuit 245 to which the light emitting diode package 250 is connected.

Porcelain enamel is applied to the outer surface of the metal plate 220 formed of decarburized metal or stainless metal by using a dry or wet spray method, or a dipping method. Then, the applied porcelain enamel is fired and fused at a high temperature within a range of 800° to 900°. In this way, the insulating film 220 is formed.

Figure 7C:
Figure 7D:
Figure 7E:
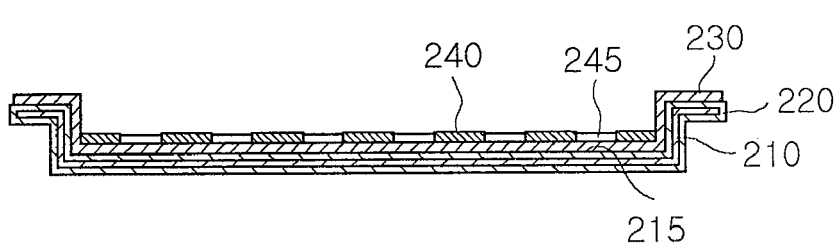

A process of forming a reflective film is formed on the mounting part 215 of the metal chassis 210 to which the insulating film 220 is applied, and forming a driving circuit by pattern printing is performed by using a first method of printing a pattern and then forming a reflective film, as shown in FIGS. 6C, 6D, and 6E, and a second method of forming a reflective film and then printing a pattern as shown in FIGS. 7C, 7D, and 7E.

That is, according to the first method, the driving circuit 245 electrically connected to the light emitting diode package 250 is formed by printing a pattern on the mounting part 215 of the metal chassis 210 to which the insulating film 220 is applied.

Here, the driving circuit 245 is formed by pattern printing in such a way that pattern screen 261 and a scraper 262 are used to apply conductive paste 263 is by screen printing. However, the present invention is not limited thereto. The driving circuit 245 may be formed by using a different method such as ink-jet printing.

The driving circuit 245 formed on the insulating film 220 by a pattern printing method is fired at high temperature, and thus adhered integrally to the insulating film 220.

Then, the reflective film 230 is formed with a predetermined thickness on the insulating film 220 and reflects light generated when the light emitting diode package 250 emits light.

Preferably, the reflective film 230 may be formed by applying porcelain enamel containing a predetermined amount of $TiO_2$ onto the entire outer surface of the insulating film 220 by a dry or wet spray method, or a dipping method.

After the driving circuit 245 formed on the insulating film 220 by the pattern printing method is fired, as shown in FIG. 6E, the reflective film 230 needs to be applied so that the reflective film 230 covers most of the driving circuit 245 and exposes external electrodes electrically connected to the light emitting diode packages 250 to the outside.

The driving circuit 245 can be protected against external environment by the reflective film 230, excluding the external electrodes.

As shown in FIG. 6F, the light emitting diode package 250 is mounted onto and electrically connected to the external electrode exposed to the outside through a region where the reflective film 230 is not applied, thereby completing the manufacture of the backlight unit 200.

Meanwhile, as shown in FIG. 7C, according to the second method, the reflective film 230 has a predetermined thickness and is evenly applied to the insulating film 220 that is applied to the mounting part 215 of the metal chassis 210.

Like the first method, the reflective film 230 is formed by applying porcelain enamel containing a predetermined amount of $TiO_2$ onto the entire outer surface of the insulating film 220 by a dry or wet spray method, or a dipping method.

As shown in FIG. 7D, the driving circuit 245 that is electrically connected to the light emitting diode package 250 is formed on the reflective film 230 by pattern printing.

Here, like the first method, the driving circuit 245 is formed by pattern printing in such a way that a pattern screen 261 and a scraper 262 are used to apply conductive paste 263 by screen printing, such that. However, the present invention is not limited thereto. The driving circuit 245 may be formed by using a different method such as ink-jet printing.

Then, a circuit protection film 240 is applied to the reflective film 230. The circuit protection film 240 is covered to protect the driving circuit 245 against external environment and expose external electrodes electrically connected to light emitting diode packages.

Preferably, the circuit protection film 240 is formed of white porcelain enamel.

In this way, the driving circuit 245 can be protected against external environment by the circuit protection film 240 except for the external electrodes.

Further, as shown in FIG. 7E, the circuit protection film 240 is fired together with the driving circuit 245 formed on the reflective film 230 by pattern printing, and adhered integrally to the reflective film 230.

Figure 7F:
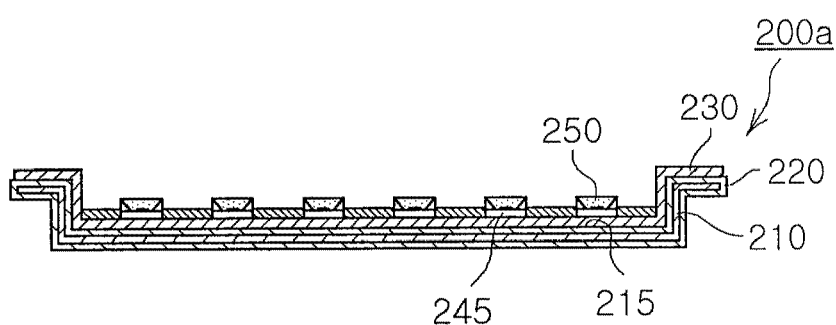

As shown in FIG. 7F, the light emitting diode package 250 is mounted onto and electrically connected to the external electrode exposed to the outside through a region of the driving circuit 245 where the circuit protection film 240 is not applied, thereby completing the manufacture of a backlight unit 200a.

As set forth above, according to the exemplary embodiments of the invention, an insulating film is formed on a metal chassis, a driving circuit is formed by pattern printing on a mounting part having a predetermined depth, and a light emitting diode package is mounted within the recess. Therefore, additional components, such as a metal substrate, a fastening member, a gap pad, and a reflective sheet, which are used according to the related art, are not required in the embodiments of the invention to thereby simplify an assembling process and reduce the number of components to increase productivity and reduce manufacturing costs. Further, an automation process can be applied.

Further, since the driving circuit can be formed on the metal chassis by pattern printing as much as necessary, manufacturing costs can be reduced as compared when the driving circuit is formed by applying a copper film to the entire surface of a substrate and patterning the applied copper film.

Reflection efficiency can be improved by a reflective film including $TiO_2$ having an excellent reflection characteristic, and discoloration of the reflective film formed of porcelain enamel is prevented even in a high-temperature environment to stably maintain reflection characteristics and thus obtain excellent optical characteristics.

Further, heat radiation can be easily achieved by the metal chassis formed of metal to improve a heat radiation characteristic as compared to a substrate formed of resin.

Further, since a process of applying the reflective film and the insulating film formed of porcelain enamel to the metal chassis and forming the driving circuit by pattern printing can be easily used for the metal chassis having a complicated shape, design flexibility can be increased, and various kinds of products can be manufactured.

While the present invention has been shown and described in connection with the exemplary embodiments, it will be apparent to those skilled in the art that modifications and variations can be made without departing from the spirit and scope of the invention as defined by the appended claims.

What is claimed is:

1. A light emitting diode substrate module comprising:
a metal plate;
an insulating film having a predetermined thickness and provided on an entire outer surface of the metal plate;
a reflective film having a predetermined thickness and provided on an entire outer surface of the insulating film; and
at least one light emitting diode package electrically connected to a driving circuit provided on the reflective film by pattern printing,
wherein the reflective film further comprises a circuit protection film, formed of porcelain enamel, the circuit protection film being configured on the driving circuit so as to enable an external electrode electrically connected to the light emitting diode package to be exposed to the outside.

2. The light emitting diode substrate module of claim 1, wherein the metal plate is formed of decarburized metal or stainless metal.

3. The light emitting diode substrate module of claim 1, wherein the insulating film is formed of porcelain enamel.

4. The light emitting diode substrate module of claim 1, wherein the porcelain enamel contains $TiO_2$.

5. A backlight unit comprising a metal chassis including a mounting part recessed to a predetermined depth in which the light emitting diode substrate module of claim 1 is mounted.

6. A method of manufacturing a light emitting diode substrate module, the method comprising:
forming an insulating film having a predetermined thickness on an entire surface of a metal plate;
forming a reflective film having a predetermined thickness on an entire surface of the insulating film; and
forming a driving circuit on an outer surface of the reflective film by pattern printing and electrically connecting the driving circuit to at least one light emitting diode package,
wherein the forming a driving circuit on an outer surface of the reflective film by pattern printing comprises forming a circuit protection film formed of porcelain enamel, the circuit protection film being configured on the driving circuit so as to enable an external electrode electrically connected to the light emitting diode package to be exposed to the outside.

7. The method of claim 6, wherein the forming an insulating film comprises applying porcelain enamel to the outer surface of the metal plate formed of decarburized metal or stainless metal by using any one of a dry or wet spray method, or a dipping method, and firing and fusing the applied porcelain enamel at high temperature.

8. The method of claim 6, wherein the forming a reflective film comprises applying porcelain enamel containing $TiO_2$ on the entire outer surface of the insulating film by using any one of a dry or wet spray method, and a dipping method.

9. A method of manufacturing a backlight unit, the method comprising mounting and fixing the light emitting diode substrate module manufactured by the method of claim 6 in a mounting part recessed to a predetermined depth in a metal chassis.

10. A backlight unit comprising:
a metal chassis having a mounting part recessed to a predetermined depth;
an insulating film having a predetermined thickness and provided on an entire outer surface of the metal chassis;
a reflective film having a predetermined thickness and provided on the insulating film corresponding to the recess; and
at least one light emitting diode package electrically connected to a driving circuit formed on the reflective film or the insulating film by pattern printing,
wherein the reflective film further comprises a circuit protection film formed of porcelain enamel, the circuit protection film being configured on the driving circuit so as to enable an external electrode electrically connected to the light emitting diode package to be exposed to the outside.

11. The backlight unit of claim 10, wherein the metal chassis is formed of decarburized metal or stainless metal.

12. The backlight unit of claim 10, wherein the insulating film is formed of porcelain enamel.

13. The backlight unit of claim 10, wherein the porcelain enamel contains $TiO_2$.

14. A method of manufacturing a backlight unit, the method comprising:
providing a metal chassis having a mounting part recessed to a predetermined depth;
forming an insulating film having a predetermined thickness on an entire outer surface of the metal chassis;
forming a reflective film having a predetermined thickness on the insulating film corresponding to the recess; and
forming a driving circuit on the reflective film by pattern printing and electrically connecting at least one light emitting diode package to the driving circuit,
wherein the forming a driving circuit on the reflective film by pattern printing comprises exposing an external electrode electrically connected to the light emitting diode package to the outside porcelain applied to the reflective film, and then firing the circuit protection film and the driving circuit.

15. The method of claim 14, wherein the forming an insulating film comprises applying porcelain enamel to an outer surface of the metal chassis formed of decarburized metal or stainless metal by using any one of a dry or wet spray method, or a dipping method, and firing and fusing the applied porcelain enamel at high temperature.

16. The method of claim 14, wherein the forming a reflective film comprises applying porcelain enamel containing $TiO_2$ by using any one of a dry or wet spray method, and a dipping method.

* * * * *